(12) United States Patent
Hu

(10) Patent No.: US 11,569,486 B2
(45) Date of Patent: Jan. 31, 2023

(54) MANUFACTURING METHOD FOR DISPLAY SUBSTRATE AND FLATTENING DEVICE

(71) Applicant: BOE TECHNOLOGY GROUP CO., LTD., Beijing (CN)

(72) Inventor: Chunjing Hu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 278 days.

(21) Appl. No.: 16/955,157

(22) PCT Filed: Dec. 12, 2018

(86) PCT No.: PCT/CN2018/120504
§ 371 (c)(1),
(2) Date: Jun. 18, 2020

(87) PCT Pub. No.: WO2019/120113
PCT Pub. Date: Jun. 27, 2019

(65) Prior Publication Data
US 2020/0388794 A1 Dec. 10, 2020

(30) Foreign Application Priority Data
Dec. 18, 2017 (CN) .......................... 201711366314.3

(51) Int. Cl.
*H01L 51/56* (2006.01)
*H01L 27/32* (2006.01)
*H01L 51/00* (2006.01)

(52) U.S. Cl.
CPC .......... *H01L 51/56* (2013.01); *H01L 27/3246* (2013.01); *H01L 51/0005* (2013.01); *H01L 51/0014* (2013.01); *H01L 2227/323* (2013.01)

(58) Field of Classification Search
None
See application file for complete search history.

(56) References Cited

U.S. PATENT DOCUMENTS 7,183,023 B2 2/2007 Sonehara et al.
2004/0197682 A1* 10/2004 Sonehara .......... G02F 1/133516
430/7

(Continued)

FOREIGN PATENT DOCUMENTS

CN 203787433 U 8/2014
CN 104760395 A 7/2015
(Continued)

OTHER PUBLICATIONS

"First Office Action and English language translation", CN Application No. 201711366314.3, dated Feb. 28, 2019, 12 pp.

(Continued)

*Primary Examiner* — Michelle Mandala
(74) *Attorney, Agent, or Firm* — Myers Bigel, P.A.

(57) ABSTRACT

A flattening device, a display substrate and a method for manufacturing the display substrate are provided. The method includes providing a base substrate, forming a pixel definition layer on the base substrate and forming an uncured sub-pixel material in a plurality of sub-pixel regions defined by the pixel definition layer, and flattening the uncured sub-pixel material by a flattening device. The flattening device includes a main body and a plurality of protrusions on a surface of the main body. A size of a protrusion surface of each protrusion facing away from the main body is not greater than that of each sub-pixel region. The sub-pixels are flattened by using the flattening device, so a sub-pixel material layer with a flat surface may be obtained, which improves the structure of the sub-pixels and improves the display performance of the display substrate.

18 Claims, 3 Drawing Sheets

(56) References Cited

U.S. PATENT DOCUMENTS

2018/0050528 A1   2/2018  Jing
2019/0051712 A1   2/2019  Yu et al.
2020/0303686 A1*  9/2020  Zhao .................. H01L 27/3283

FOREIGN PATENT DOCUMENTS

| CN | 107068861 A | 8/2017 |
| CN | 107201504 A | 9/2017 |
| CN | 107452782 A | 12/2017 |
| CN | 108123070 A | 6/2018 |
| JP | H1172799 A | 3/1999 |
| JP | H1191229 A | 4/1999 |
| JP | 2008091071 A | 4/2008 |

OTHER PUBLICATIONS

"International Search Report and English language translation", International Application No. PCT/CN2018/120504, dated Feb. 28, 2019, 11 pp.

* cited by examiner

MANUFACTURING METHOD FOR DISPLAY SUBSTRATE AND FLATTENING DEVICE

CROSS REFERENCE TO RELATED APPLICATIONS

The present application is a 35 U.S.C. 371 national stage application of a PCT International Application No. PCT/CN2018/120504, filed on Dec. 12, 2018, which claims the priority benefits of the patent application No. 201711366314.3 filed to the Patent Office of China on Dec. 18, 2017, the disclosure of which is incorporated herein by reference.

TECHNICAL FIELD

This disclosure relates to the field of display technologies, and in particular to a method for manufacturing a display substrate and a flattening device.

BACKGROUND

With the development of display technologies, organic electroluminescent displays have been widely used due to their excellent performances such as self-luminosity, rapid response, wide angle of view and high brightness. An organic electroluminescent device usually comprises an organic light-emitting layer. The organic light-emitting layer is usually formed by allowing ink droplets to flow into sub-pixel regions defined by a pixel definition layer.

SUMMARY

An embodiment of this disclosure provides a method for manufacturing a display substrate, comprising: providing a base plate; forming a pixel definition layer on the base substrate, and forming an uncured sub-pixel material in a plurality of sub-pixel regions defined by the pixel definition layer; and flattening the uncured sub-pixel material by a flattening device. The flattening device comprises a main body and a plurality of protrusions, and the plurality of protrusions are arranged on a surface of the main body. A size of a protrusion surface of each protrusion facing away from the main body is not greater than a size of each sub-pixel region.

According to some embodiments of the disclosure, forming the pixel definition layer on the base substrate and forming the uncured sub-pixel material in the plurality of sub-pixel regions defined by the pixel definition layer comprises: forming the pixel definition layer on the base substrate by a patterning process, and forming an inkjet liquid by inkjet printing in the plurality of sub-pixel regions defined by the pixel definition layer.

According to some embodiments of the disclosure, the inkjet liquid comprises an organic light-emitting material.

According to some embodiments of the disclosure, the method further comprises performing pre-curing treatment on the sub-pixel material while flattening the uncured sub-pixel material by the flattening device.

According to some embodiments of the disclosure, the main body comprises a roller, the flattening the uncured sub-pixel material by the flattening device comprises: rolling the flattening device on the uncured sub-pixel material such that a surface of the sub-pixel material is flattened.

According to some embodiments of the disclosure, the main body comprises an alignment part, the flattening the uncured sub-pixel material by the flattening device comprises: aligning the plurality of protrusions of the flattening device with the plurality of sub-pixel regions respectively by means of the alignment part on the main body of the flattening device; and flattening the sub-pixel material within each sub-pixel region by means of the protrusions of the flattening device.

According to some embodiments of the disclosure, the method comprises: flattening the uncured sub-pixel material for multiple times by using the flattening device; and displacing the protrusions of the flattening device relative to the sub-pixel regions after one time of flattening and before a next flattening during the flattening the uncured sub-pixel material for multiple times.

According to some embodiments of the disclosure, the flattening device comprises an anti-corrosion layer on the protrusion surface of the protrusion.

According to some embodiments of the disclosure, the flattening device comprises an additional anti-corrosion layer on other surfaces of the protrusion adjacent to the protrusion surface.

According to some embodiments of the disclosure, a material of the anti-corrosion layer comprises at least one selected from a group consisting of highly branched oligomer, perfluoropolyether and ethyl methacrylate.

According to some embodiments of the disclosure, a material of the protrusion comprises a lyophobic material for the sub-pixel material.

According to some embodiments of the disclosure, the material of the protrusion comprises fluoropolymer, and a material of the main body comprises fluoropolymer or quartz.

A further embodiment of the disclosure provides a flattening device for flattening sub-pixel materials of a display substrate. The flattening device comprises a main body and a plurality of protrusions on a surface of the main body, a size of a protrusion surface of each protrusion facing away from the main body is not greater than a size of each sub-pixel region of the display substrate.

According to some embodiments of the disclosure, the main body comprises a roller, and the plurality of protrusions are arranged on a circumferential surface parallel to a long axis direction of the roller.

According to some embodiments of the disclosure, the flattening device comprises an anti-corrosion layer on the protrusion surface of the protrusion.

According to some embodiments of the disclosure, the flattening device comprises an additional anti-corrosion layer on other surfaces of the protrusion adjacent to the protrusion surface.

According to some embodiments of the disclosure, a material of the anti-corrosion layer comprises at least one selected from a group consisting of highly branched oligomer, perfluoropolyether and ethyl methacrylate.

According to some embodiments of the disclosure, a material of the protrusion comprises a lyophobic material for the sub-pixel material.

According to some embodiments of the disclosure, the material of the protrusion comprises fluoropolymer, and a material of the main body comprises fluoropolymer or quartz.

According to some embodiments of the disclosure, the flattening device fuehrer comprises an alignment part on the main body, the alignment part is configured to align the plurality of protrusions of the flattening device with the sub-pixels respectively.

DETAILED DESCRIPTION OF EMBODIMENTS

In order to render objectives, features and advantages of the disclosure clearer, the disclosure will be further explained below in detail with reference to drawings and specific embodiments.

In the description of this disclosure, unless otherwise explained, "multiple" means two or more; directional or positional relations indicated by terms such as "up", "down", "left", "right", "inner" and "outer" are directional or positional relations shown on the basis of the drawings. They are used only for describing this disclosure and simplifying the description, rather than indicating or implying that the indicated device or element must be orientated specifically, or constructed and operated in a specific orientation, so theses should not be construed as limiting the present application.

In the description of this disclosure, it should be noted that terms such as "install", "link" and "connect" should be understood in a broad sense unless otherwise prescribed and defined explicitly. For example, "connect" may refer to fixed connection, or detachable connection, or integrated connection. It may mean mechanical connection or electrical connection; it may also refer to direct connection, or indirect connection via intermediate media. For a person having ordinary skills in the art, the specific meanings of the above terms in this disclosure may be understood upon specific situations.

The embodiments of this disclosure will be further explained in detail with reference to the drawings and examples. The embodiments below are used for explaining this disclosure rather than limiting the protection scope of the present application.

Figure 1:
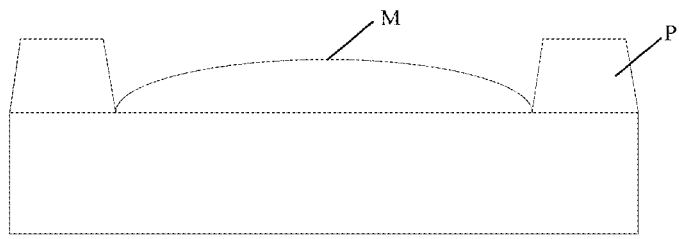
FIG. 1 and FIG. 2 are schematic structure views of an organic light-emitting layer manufactured by an inkjet printing method known to the inventor.
Figure 2:
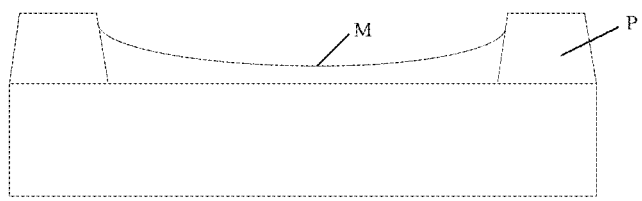

Inventor of the present application have realized that, during process of manufacturing layer structures of pixel regions of a display substrate, due to factors such as the surface energy difference between the ink droplets of the pixel material and the pixel definition layer, the trapezoid structure of the pixel definition layer P and the ink droplet drying behavior, the surface of the dried pixel material ink droplet M is usually convex or concave as shown in FIG. 1 and FIG. 2, rather than flat. This may give rise to defects such as electric leakage of the light-emitting device and uneven light emission, and thus degrade the display performance of the display device.

Figure 3:
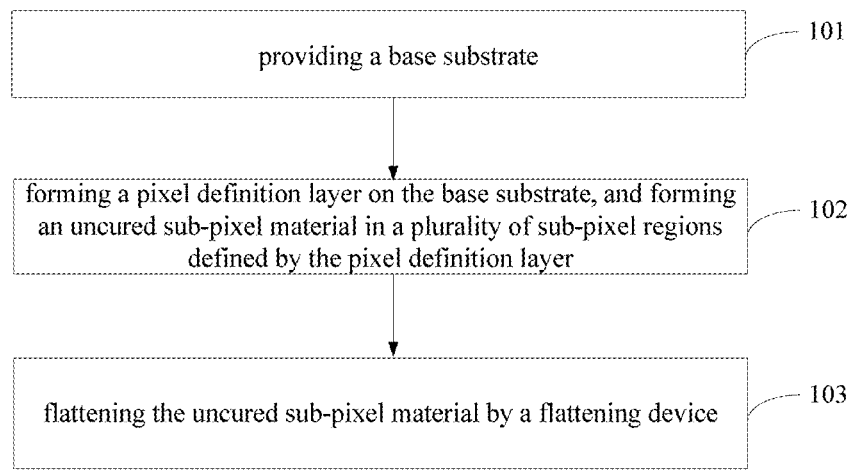
FIG. 3 is a flow chart of a method for manufacturing a display substrate according to an embodiment of this disclosure.

In view of this, an embodiment of this disclosure provides a method for manufacturing a display substrate, which, as shown in FIG. 3, comprises steps of: 101, providing a base substrate; 102, forming a pixel definition layer on the base substrate, and forming an uncured sub-pixel material in a plurality of sub-pixel regions defined by the pixel definition layer; 103, flattening the uncured sub-pixel material by a flattening device. According to an embodiment of the disclosure, the flattening device comprises a main body and a plurality of protrusions, the plurality of protrusions are arranged on a surface of the main body, and a size of a protrusion surface of each protrusion facing away from the main body is not greater than that of each sub-pixel region.

Figure 4:
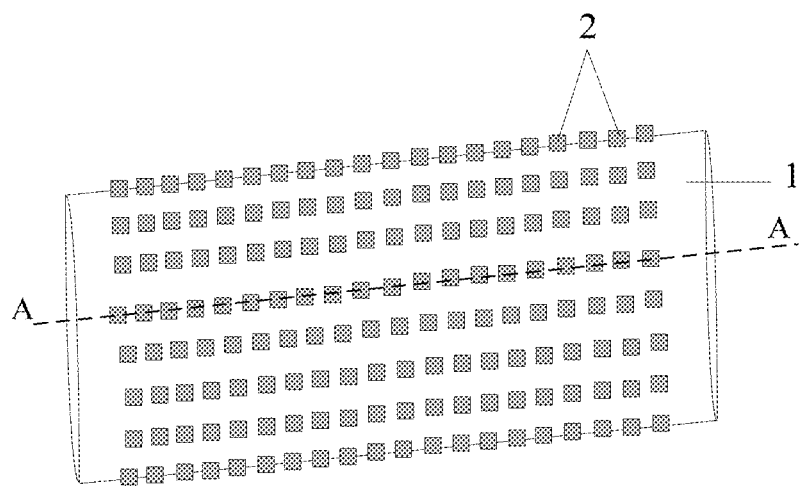
FIG. 4 is a schematic structure view of a flattening device used in the method for manufacturing a display substrate according to an embodiment of this disclosure.
Figure 5:
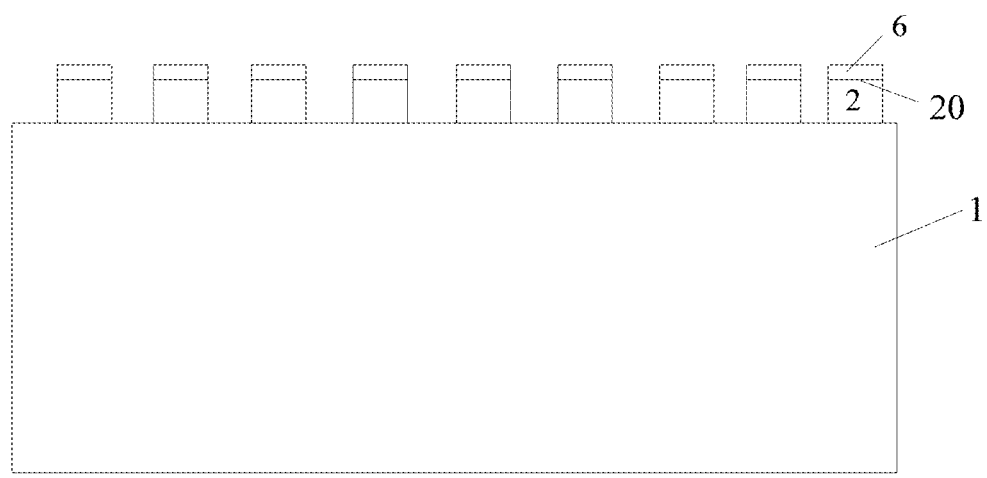
FIG. 5 is a partial section view of the flattening device of FIG. 4 taken along line AA.

FIG. 4 illustrates a structure view of a flattening device used in step 103, and FIG. 5 is a partial section view of the flattening device taken along dotted line AA in FIG. 4. The flattening device comprises a main body 1 and a plurality of protrusions 2, the protrusions 2 are arranged on a surface of the main body 1, and a size of a protrusion surface 20 of each protrusion 2 facing away from the main body 1 is not greater than that of each sub-pixel region.

The display substrate mentioned herein may be any display substrate, which includes but is not limited to an organic light-emitting diode (OLED) display substrate. The OLED display substrate may comprise a base substrate and a pixel definition layer on the base substrate. The pixel definition layer may define a plurality of sub-pixels. Various necessary sub-pixel materials may be formed within the sub-pixel regions. For example, for an OLED display substrate, the sub-pixel material comprises organic light-emitting material, functional layer material, electrode material and so on. During the process of flattening the sub-pixel material of the OLED display substrate by means of the flattening device, the protrusions are aligned with the sub-pixel regions defined by the pixel definition layer, and a force will be applied by the flattening device to the sub-pixel material to flatten the sub-pixel material.

Figure 6:
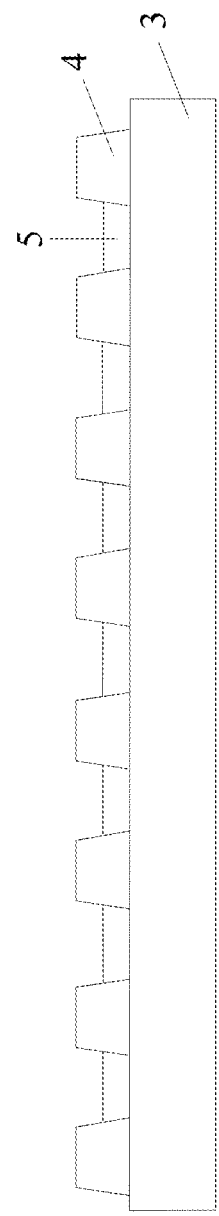
FIG. 6 is a schematic structure view of a display substrate manufactured by the method of FIG. 3.

With the method for manufacturing a display substrate provided in the embodiment of this disclosure, sub-pixels with a flat surface may be obtained. FIG. 6 is a schematic view of a display substrate obtained by using the method for manufacturing a display substrate according to an embodiment of this disclosure. Referring to FIG. 6, the display panel comprises a base substrate 3, a pixel definition layer 4 and sub-pixels 5, the pixel definition layer 4 and the sub-pixels 5 are formed on the base substrate 3, the pixel definition layer 4 defines sub-pixel regions arranged in an array, the sub-pixels 5 are formed within the sub-pixel regions, upper surfaces of the sub-pixels are flat, and the display substrate comprising the sub-pixels has a better display performance.

According to some embodiments of this disclosure, the pixel definition layer may be formed on the base substrate by a patterning process. For example, a film of a pixel definition layer material may be formed first on the base substrate, and then a pixel definition layer with a desired pattern is formed from the film by a patterning process. After that, an inkjet liquid may be formed by inkjet printing within a plurality of sub-pixel regions defined by the pixel definition layer. The inkjet liquid may comprise any necessary sub-pixel material within the sub-pixel regions, which includes but is not limited to an organic light-emitting material.

According to some embodiments of this disclosure, the method for manufacturing a display substrate further comprises: performing pre-curing treatment on the sub-pixel material while flattening the uncured sub-pixel material by using the flattening device. The pre-curing treatment may comprise a drying process. After the sub-pixel material is filled into the sub-pixel regions, it may be flattened by the flattening device during the pre-curing treatment. For example, the sub-pixel material may be flattened repeatedly by the flattening device during the continuous volatilization of the components of the sub-pixel material, thereby obtaining a sub-pixel material with a flat surface. The step of performing pre-curing treatment on the sub-pixel material may comprise: performing pre-curing treatment on the sub-pixel material by vacuum drying.

In the example of the flattening device shown in FIG. 4, the main body comprises a roller, and the pitch between adjacent protrusions of the plurality of protrusions of the flattening device is the same as the pitch between adjacent sub-pixels of the display substrate. When using the flattening device to flatten the uncured sub-pixel material, the flattening device may be controlled to roll on the uncured sub-pixel material such that a surface of the sub-pixel material is flattened.

In further embodiments, the main body is provided with an alignment part, in this case, the step of flattening the uncured sub-pixel material by the flattening device comprises: aligning the plurality of protrusions of the flattening device with the plurality of sub-pixel regions one by one by means of the alignment part on the main body of the flattening device; flattening the sub-pixel material within each sub-pixel region by means of the protrusions of the flattening device. The alignment part is used to align the protrusions of the flattening device with the sub-pixels respectively. An example of the alignment part includes but is not limited to alignment baffles, alignment marks and so on. Such embodiments may ensure that the protrusions of the flattening device may be accurately located within the sub-pixel regions during the flattening treatment of the sub-pixel material.

In further embodiments, the method for manufacturing a display substrate further comprises: flattening the uncured sub-pixel material for several times by using the flattening device, and displacing the protrusions of the flattening device relative to the sub-pixel regions after finishing one time of flattening and before the next flattening. By performing flattening on the sub-pixel material of the display substrate for multiple times with the flattening device and not flattening exactly the same areas of the sub-pixel material during each flattening, a flatter surface of the sub-pixel material within the sub-pixel region may be achieved. It may be understood that the displacement is very subtle. In practice, operation parameters of a roller-type flattening device may be set upon actual needs, for example, the pressure applied by the roller-type flattening device to the sub-pixel material may be in the range of 10 to 20 kgf, the moving speed of the roller-type flattening device may be 7.8-78 mm/s, and the number of repeated flattening operations performed by the roller-type flattening device may be smaller than or equal to 10.

During the treatment of the sub-pixel material by using the flattening device, the protrusion needs to be in contact with the sub-pixel material (e.g., an organic material), and in order to prevent the protrusion from being corroded, according to some embodiments of this disclosure, an anti-corrosion layer 6 may be provided on a protrusion surface 20 of the protrusion. Furthermore, according to further embodiments, the anti-corrosion layer may also be provided on other surfaces of the protrusion adjacent to the protrusion surface 20. The anti-corrosion layer may resist possible corrosion of the flattening device by the sub-pixel material. The anti-corrosion layer is a material layer with corrosion resistance, which may be made of various materials, e.g., the material of the anti-corrosion layer may comprise at least one selected from a group consisting of highly branched oligomer, perfluoropolyether, ethyl methacrylate, and other suitable materials, as well as a combination thereof. The material of the anti-corrosion layer is not specifically limited herein.

During the flattening treatment of the sub-pixel material by using the flattening device, in order to prevent the protrusion of the flattening device from adhering to the sub-pixel material and destroying the sub-pixels, according to some embodiments of this disclosure, a material of the protrusion comprises a lyophobic material for the sub-pixel material. The material of the protrusion may be selected upon the actual sub-pixel material. For example, in a case where the sub-pixel material is an organic light-emitting layer, the material of the protrusion may comprise fluoropolymer which is lyophobic, and a material of the main body may comprise fluoropolymer or quartz. In a case where an anti-corrosion layer is provided on the protrusion surface of the flattening device, the lyophobic material may be selected to form the anti-corrosion layer.

Another embodiment of this disclosure provides a flattening device for flattening each sub-pixel material of a display substrate, and the flattening device comprises a main body and a plurality of protrusions, the plurality of protrusions being arranged on a surface of the main body. A size of a protrusion surface of each protrusion facing away from the main body is not greater than that of each sub-pixel region. For example, in a case where the sub-pixel region is a regular rectangle, a length of the protrusion surface of the protrusion is not greater than that of the sub-pixel region, and a width of the protrusion surface is not greater than that of the sub-pixel region.

The sub-pixel material within each sub-pixel region on the display substrate may be flattened repeatedly by using the flattening device so as to improve the flattening effect. The number of flattening operations of the sub-pixels of the display substrate performed by the flattening device may be set upon actual needs.

The main body may be in form of various structures, e.g., the roller as shown in FIG. 4, and in other embodiments, the main body may be a plate or the like. In an embodiment where the main body is a roller, the plurality of protrusions may be arranged on a circumferential surface parallel to a long axis direction of the roller so as to prevent the main body from exerting too much pressure on the sub-pixel material. The roller is placed on the display substrate, and each protrusion of the roller is moved into a corresponding sub-pixel region, and the flattening treatment of the sub-pixels is achieved by rolling the roller.

Referring to FIG. 3 again, according to some embodiments of this disclosure, the flattening device comprises a roller 1 and a plurality of protrusions 2, the plurality of protrusions 2 are arranged in an array on a surface of the roller 1. When the sub-pixels are flattened by using the flattening device shown in FIG. 3, the protrusion 2 is moved to an area of the sub-pixel region during the process of rolling the roller 1. The pixel definition layer of the display substrate may be located within a gap between two adjacent protrusions. Specific structures and sizes of the main body and the protrusion may be set according to practical requirements.

According to further embodiments of this disclosure, the flattening device may further comprise a controller and a driving mechanism, the controller is electrically connected with the driving mechanism, the driving mechanism is connected with the main body, and the driving mechanism may drive the main body to move or to move and rotate. By sending to the driving mechanism a control signal for controlling the driving mechanism to move or rotate, the controller finally achieves movement, or movement and rotation of the main body, and thus achieves flattening treatment of the organic light-emitting layer by the flattening device. The controller may comprise a control chip. In an embodiment, the driving mechanism may comprise a motor and a force transmission mechanism (which e.g. includes a connecting rod, a conveyor belt and so on). The force transmission mechanism may be coupled to the motor and the flattening device respectively, and a push force or a pull force is generated based on the rotation of the motor and then exerted on the flattening device via the force transmission mechanism, and thereby movement of the flattening device is achieved. As mentioned above, the flattening device may be configured to flatten the sub-pixel material of the display substrate for multiple times such that the surface of the sub-pixel material is flat. During the process of performing flattening operation by the flattening device, the controller may control the flattening device such that the protrusion is subtly displaced relative to the sub-pixel region after one time of flattening and before the next flattening, which facilitates a flatter surface of the sub-pixel material within the sub-pixel region.

Furthermore, in further embodiments, the flattening device may further comprise a touch module, the touch module is electrically connected with the controller, and control instructions for the flattening device may be inputted into the controller via the touch module. The touch module comprises but is not limited to a touch screen or the like. In another embodiment, the flattening device further comprises a sound receiver electrically connected with the controller to transmit sound control intrusions it receives to the controller. The control instructions may comprise various contents, e.g., switching-on the flattening device, switching-off the flattening device, operation parameters of the flattening device (e.g., the magnitude of the pressure applied by the flattening device onto the sub-pixel material, the number of flattening operations) and so on, and the specific contents of the control instructions may be set according to practical requirements. An embodiment of this disclosure further provides a display substrate, which is manufactured by using the method provided in the above embodiments of this disclosure. With the display substrate manufactured by using the method provided in the embodiments of this disclosure, the sub-pixel material layer in the display substrate has a flat surface, and the display substrate has a better display performance.

An embodiment of this disclosure further provides a display panel, comprising the display substrate provided in the above embodiment of this disclosure.

Since the display panel comprises the above display substrate, the display panel has the advantages of the display substrate, which will not be repeated herein for simplicity.

The embodiments in the description are described in a progressive manner, and each embodiment focuses on a difference of the embodiment from the others, and for the same or similar portions between the embodiments, they may refer to each other.

A flattening device, a display substrate and a manufacturing method thereof provided in this disclosure have been introduced above in detail. Specific examples are used herein for elaborating principles and implementations of this disclosure, and the explanations of the above embodiments are only used to help understanding of the method and main idea of this disclosure; meanwhile, a person having ordinary skills in the art may modify the embodiments and application scopes according to the idea of this disclosure. In conclusion, the content of this description should not be construed as limiting the scope of the present application.

The invention claimed is:

1. A method for manufacturing a display substrate, comprising:
   providing a base substrate;
   forming a pixel definition layer on the base substrate, and forming an uncured sub-pixel material in a plurality of sub-pixel regions defined by the pixel definition layer; and
   flattening the uncured sub-pixel material by a flattening device,
   wherein the flattening device comprises a main body and a plurality of protrusions,
   wherein the plurality of protrusions are on a surface of the main body, and
   wherein a size of a protrusion surface of each of the plurality of protrusions facing away from the main body is not greater than a size of each sub-pixel region,
   wherein the main body comprises an alignment part, and wherein the flattening the uncured sub-pixel material by the flattening device comprises:
   aligning the plurality of protrusions of the flattening device with the plurality of sub-pixel regions respectively using the alignment part on the main body of the flattening device; and
   flattening the uncured sub-pixel material within each sub-pixel region using the protrusions of the flattening device.

2. The method according to claim 1, wherein the forming the pixel definition layer on the base substrate and forming the uncured sub-pixel material in the plurality of sub-pixel regions defined by the pixel definition layer comprises:
   forming the pixel definition layer on the base substrate by a patterning process, and
   forming an inkjet liquid by inkjet printing in the plurality of sub-pixel regions defined by the pixel definition layer.

3. The method according to claim 2, wherein the inkjet liquid comprises an organic light-emitting material.

4. The method according to claim 1, wherein the method further comprises:
   performing pre-curing treatment on the uncured sub-pixel material while flattening the uncured sub-pixel material by the flattening device.

5. The method according to claim 1, wherein the main body comprises a roller, and wherein the flattening the uncured sub-pixel material by the flattening device comprises:
   rolling the flattening device on the uncured sub-pixel material such that a surface of the uncured sub-pixel material is flattened.

6. The method according to claim 1, wherein the method further comprises:
   flattening the uncured sub-pixel material multiple times by using the flattening device; and
   displacing the protrusions of the flattening device relative to the sub-pixel regions after one time of flattening and before a next flattening during the flattening the uncured sub-pixel material multiple times.

7. The method according to claim 1, wherein the flattening device comprises an anti-corrosion layer on the protrusion surface of each of the plurality of protrusions.

8. The method according to claim 7, wherein the flattening device comprises an additional anti-corrosion layer on other surfaces of each of the plurality of protrusions adjacent to the protrusion surface.

9. The method according to claim 8, wherein a material of the anti-corrosion layer comprises at least one selected from a group consisting of highly branched oligomer, perfluoropolyether and ethyl methacrylate.

10. The method according to claim 1, wherein a material of the protrusion comprises a lyophobic material for the uncured sub-pixel material.

11. The method according to claim 10, wherein the material of the protrusion comprises fluoropolymer, and a material of the main body comprises fluoropolymer or quartz.

12. A flattening device for flattening sub-pixel materials of a display substrate, wherein the flattening device comprises:
a main body; and
a plurality of protrusions on a surface of the main body, wherein a size of a protrusion surface of each of the plurality of protrusions facing away from the main body is not greater than a size of each sub-pixel region of the display substrate,
wherein the flattening device comprises an anti-corrosion layer on the protrusion surface of each of the plurality of protrusions.

13. The flattening device according to claim 12, wherein the main body comprises a roller, and
wherein the plurality of protrusions are on a circumferential surface parallel to a long axis direction of the roller.

14. The flattening device according to claim 12, wherein the flattening device comprises an additional anti-corrosion layer on other surfaces of each of the plurality of protrusions adjacent to the protrusion surface.

15. The flattening device according to claim 14, wherein a material of the anti-corrosion layer comprises at least one selected from a group consisting of highly branched oligomer, perfluoropolyether and ethyl methacrylate.

16. The flattening device according to claim 12,
wherein the flattening device further comprises an alignment part on the main body, and
wherein the alignment part is configured to align the plurality of protrusions of the flattening device with the sub-pixels respectively.

17. A flattening device for flattening sub-pixel materials of a display substrate, wherein the flattening device comprises:
a main body; and
a plurality of protrusions on a surface of the main body, wherein a size of a protrusion surface of each of the plurality of protrusions facing away from the main body is not greater than a size of each sub-pixel region of the display substrate, wherein a material of the protrusion comprises a lyophobic material for the sub-pixel materials.

18. The flattening device according to claim 17, wherein the material of the protrusion comprises fluoropolymer, and a material of the main body comprises fluoropolymer or quartz.

* * * * *